(12) United States Patent
Hsu et al.

(10) Patent No.: US 12,253,879 B2
(45) Date of Patent: Mar. 18, 2025

(54) ELECTRONIC DEVICE WITH RECEIVING FUNCTION

(71) Applicant: Quanta Computer Inc., Taoyuan (TW)

(72) Inventors: Chia-Jung Hsu, Taoyuan (TW); Shen-Pu Hsieh, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 178 days.

(21) Appl. No.: 18/190,504

(22) Filed: Mar. 27, 2023

(65) Prior Publication Data

US 2024/0219957 A1     Jul. 4, 2024

(30) Foreign Application Priority Data

Jan. 3, 2023   (TW) .................................. 112200004

(51) Int. Cl.
*G06F 1/16*     (2006.01)
*G06F 3/0354*   (2013.01)
*H05K 5/02*     (2006.01)

(52) U.S. Cl.
CPC ........ *G06F 1/1607* (2013.01); *G06F 3/03545* (2013.01); *G06F 1/1684* (2013.01); *G06F 2200/1632* (2013.01); *H05K 5/02* (2013.01); *H05K 5/0217* (2013.01)

(58) Field of Classification Search
CPC .... G06F 1/1607; G06F 1/1613; G06F 1/1615; G06F 1/1616; G06F 1/1633; G06F 1/1658; G06F 1/1675; G06F 1/1684; G06F 1/169; G06F 1/185; G06F 1/186; G06F 1/187; G06F 2200/1632; G06F 3/03545; H05K 5/02

USPC ....................................................... 361/679.4
See application file for complete search history.

(56) References Cited

U.S. PATENT DOCUMENTS

| | | | | |
|---|---|---|---|---|
| 5,179,502 A | * | 1/1993 | Matsuda | G06F 15/0216 |
| | | | | 708/110 |
| 10,426,239 B2 | * | 10/2019 | Yang | A45C 13/001 |
| 2010/0225210 A1 | * | 9/2010 | Tseng | G06F 1/1616 |
| | | | | 74/25 |
| 2013/0301200 A1 | * | 11/2013 | Leung | G06F 1/1626 |
| | | | | 361/679.4 |

(Continued)

FOREIGN PATENT DOCUMENTS

CN      203552124 U   *  4/2014
CN      107294155 A   *  10/2017
(Continued)

*Primary Examiner* — Adrian S Wilson
*Assistant Examiner* — Gage Crum
(74) *Attorney, Agent, or Firm* — McClure, Qualey & Rodack, LLP (57) ABSTRACT

An electronic device with a receiving function is provided. The electronic device is adapted to receive and shift out an object. The electronic device includes a device housing, an actuating unit, a linkage unit and a holder. The actuating unit is disposed in the device housing. The linkage unit is connected to the actuating unit, wherein the actuating unit is adapted to move the linkage unit. The holder is connected to the device housing and the linkage unit, wherein the holder is adapted to be rotated between an extended orientation and a received orientation relative to the device housing, and the object is detachably connected to the holder.

5 Claims, 7 Drawing Sheets

(56) References Cited

U.S. PATENT DOCUMENTS

| | | | | |
|---|---|---|---|---|
| 2014/0327661 | A1* | 11/2014 | Ashcraft | G06F 3/03545 |
| | | | | 345/179 |
| 2016/0190839 | A1* | 6/2016 | Otsuka | G06F 1/266 |
| | | | | 320/115 |
| 2018/0267625 | A1* | 9/2018 | Yang | G06F 3/0393 |
| 2019/0163291 | A1* | 5/2019 | Chen | G06F 1/1616 |
| 2022/0141985 | A1* | 5/2022 | Chang | H05K 7/1489 |
| | | | | 361/725 |
| 2023/0097723 | A1* | 3/2023 | Wen | G06F 1/1607 |
| | | | | 361/679.02 |
| 2023/0144918 | A1* | 5/2023 | Zhong | G06F 1/181 |
| | | | | 361/600 |
| 2023/0283108 | A1* | 9/2023 | An | H02J 50/10 |
| | | | | 320/108 |

FOREIGN PATENT DOCUMENTS

| | | | | |
|---|---|---|---|---|
| CN | 108170213 | A | * | 6/2018 |
| CN | 210348306 | U | * | 4/2020 |
| CN | 210624072 | U | * | 5/2020 |
| CN | 114241894 | A | * | 3/2022 |

* cited by examiner

ELECTRONIC DEVICE WITH RECEIVING FUNCTION

CROSS REFERENCE TO RELATED APPLICATIONS

This application claims priority of Taiwan Patent Application No. 112200004, filed on Jan. 3, 2023, the entirety of which is incorporated by reference herein.

BACKGROUND OF THE INVENTION

Field of the Invention

The present invention relates to an electronic device, and, in particular, to an electronic device with a receiving function.

Description of the Related Art

Stylus pens are commonly utilized in notebooks, tablets, cell phones and other electronic devices. Conventionally, a receiving recess is formed on the housing of the electronic device, and the stylus pen is adapted to be inserted into that receiving recess. When the user needs to use the stylus pen, the user must shift out the stylus pen manually. The conventional design is not convenient for the user.

BRIEF SUMMARY OF THE INVENTION

In one embodiment, an electronic device with a receiving function is provided. The electronic device is adapted to receive and shift out an object. The electronic device includes a device housing, an actuating unit, a linkage unit and a holder. The actuating unit is disposed in the device housing. The linkage unit is connected to the actuating unit, wherein the actuating unit is adapted to move the linkage unit. The holder is connected to the device housing and the linkage unit, wherein the holder is adapted to be rotated between an extended orientation and a received orientation relative to the device housing, and the object is detachably connected to the holder.

In one embodiment, one end of the holder is rotatably connected to the device housing, and the other end of the holder is rotatably connected to the linkage unit.

In one embodiment, the holder comprises a slot, the device housing comprises a housing post, and the housing post is connected to the slot.

In one embodiment, the linkage unit comprises a first rod and a second rod, one end of the first rod is rotatably connected to the actuating unit, the other end of the first rod is rotatably connected to one end of the second rod, the other end of the second rod is rotatably connected to the holder, and the second rod pivots on the device housing.

In one embodiment, the actuating unit comprises a block, the block is connected to the first rod, the block is adapted to be linearly moved between a first position and a second position, and when the block is in the first position, the holder is in the extended orientation, and when the block is in the second position, the holder is in the received orientation.

In one embodiment, the actuating unit further comprises an electric motor, a threaded rod and a guide post, the electric motor is connected to the threaded rod, the block is connected to the threaded rod and the guide post, the electric motor is adapted to rotate the threaded rod, and the threaded rod moves the block along the guide post.

In one embodiment, the actuating unit further comprises an electric motor, a gear and a rack, the electric motor is connected to the gear, and the gear is connected to the rack.

In one embodiment, the object is a stylus pen, the stylus pen comprises a pen body and a pen nib, the pen nib is connected to the pen body, the holder comprises a holding recess, the pen body is adapted to be disposed in the holding recess, and when the holder is in the received orientation, the stylus pen is adapted to be received in the device housing, and a body surface of the pen body and the device housing are a part of the appearance of the electronic device.

In one embodiment, the holder comprises a nib container, the nib container is located between the slot and the holding recess, and the pen nib is adapted to be inserted into the nib container.

In one embodiment, the holder comprises a magnetizable material, the stylus pen comprises a magnet, the magnet is disposed in the pen body, and the magnet is adapted to be attached to the holder by magnetic force.

Utilizing the electronic device of the embodiment of the invention, when the user needs to use the stylus pen, the user operate the operation interface to send the control signal, and the holder is rotated to the extended orientation. The user therefore can take the stylus pen easily. Compared with the conventional art, the electronic device of the embodiment of the invention is convenient and provides an elegant operation experience.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
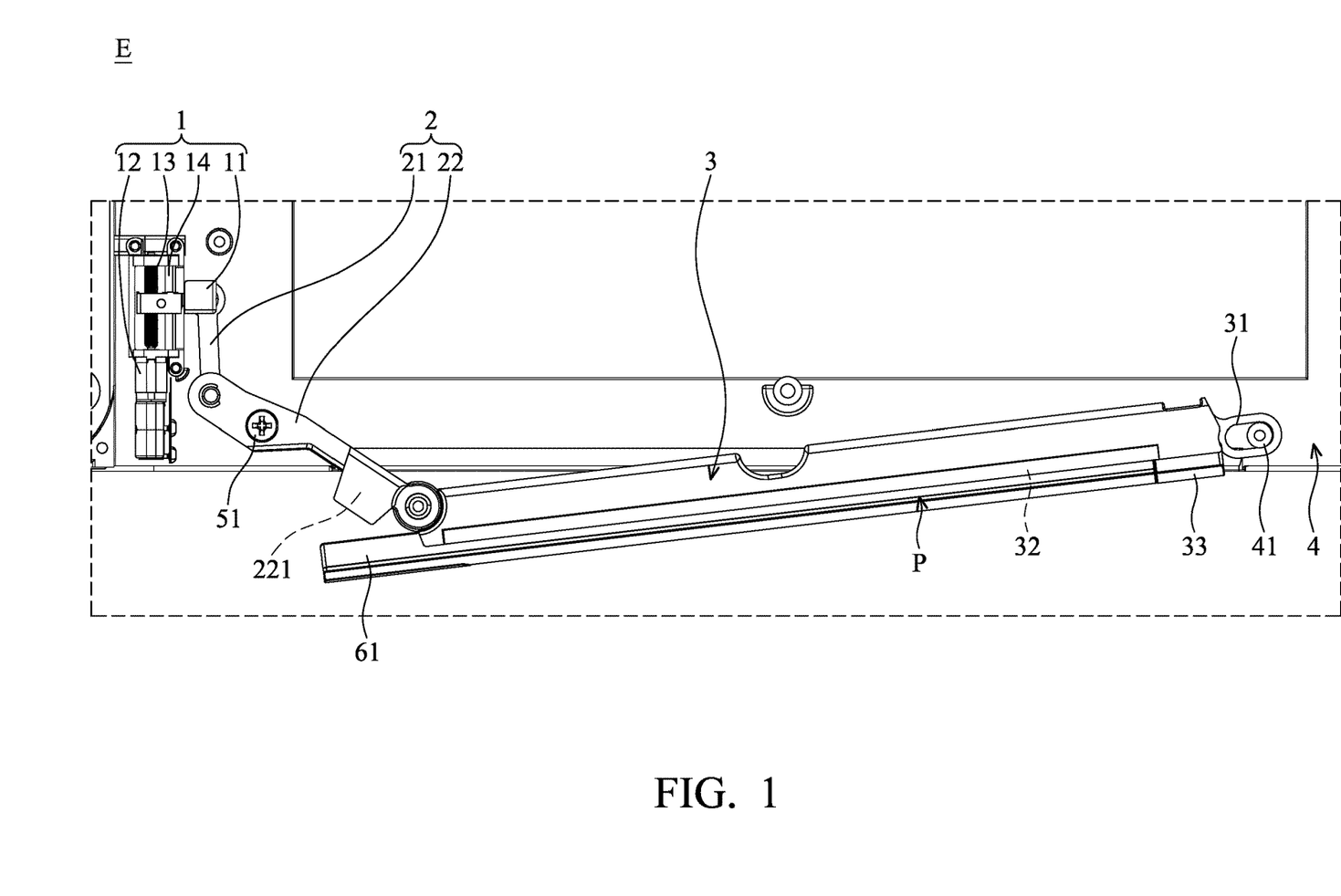
FIG. 1 shows a portion of an electronic device with a receiving function of the embodiment of the invention, wherein a holder is in an extended orientation.
Figure 2:
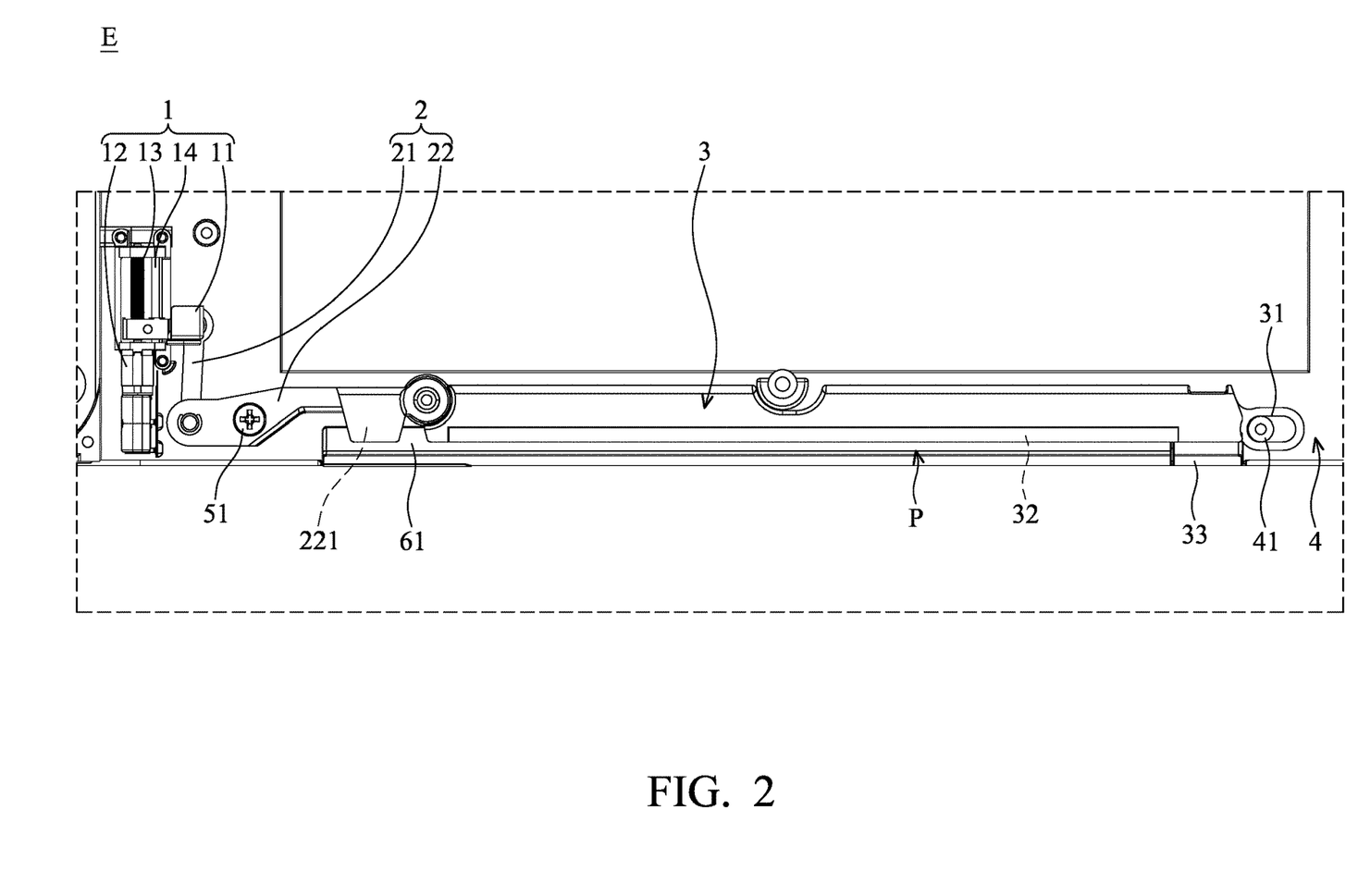
FIG. 2 shows a portion of the electronic device with a receiving function of the embodiment of the invention, wherein the holder is in a received orientation.

FIG. 1 shows a portion of an electronic device with a receiving function of the embodiment of the invention, wherein a holder is in an extended orientation. FIG. 2 shows a portion of the electronic device with a receiving function of the embodiment of the invention, wherein the holder is in a received orientation. With reference to FIGS. 1 and 2, in one embodiment, an electronic device E with a receiving function is provided. The electronic device E is adapted to receive and shift out an object P. The electronic device E includes a device housing 4, an actuating unit 1, a linkage unit 2 and a holder 3. The actuating unit 1 is disposed in the device housing 4. The linkage unit 2 is connected to the actuating unit 1, wherein the actuating unit 1 is adapted to move the linkage unit 2. The holder 3 is connected to the device housing 4 and the linkage unit 2. The holder 3 is adapted to be rotated between an extended orientation (FIG. 1) and a received orientation (FIG. 2) relative to the device housing 4, and the object P is detachably connected to the holder 3.

With reference to FIGS. 1 and 2, in one embodiment, one end of the holder 3 is rotatably connected to the device housing 4, and the other end of the holder 3 is rotatably connected to the linkage unit 2.

With reference to FIGS. 1 and 2, in one embodiment, the holder 3 comprises a slot 31. The device housing 4 comprises a housing post 41. The housing post 41 is connected to the slot 31. Therefore, one end of the holder 3 is rotatably connected to the device housing 4.

With reference to FIGS. 1 and 2, in one embodiment, the linkage unit 2 comprises a first rod 21 and a second rod 22. One end of the first rod 21 is rotatably connected to the actuating unit 1. The other end of the first rod 21 is rotatably connected to one end of the second rod 22. The other end of the second rod 22 is rotatably connected to the holder 3. The second rod 22 pivots on the device housing 4.

With reference to FIGS. 1 and 2, in one embodiment, the second rod 22 pivots on the device housing 4 by a bolt 51. In this embodiment, the bolt 51 is utilized as a fulcrum of the second rod 22.

Figure 3A:
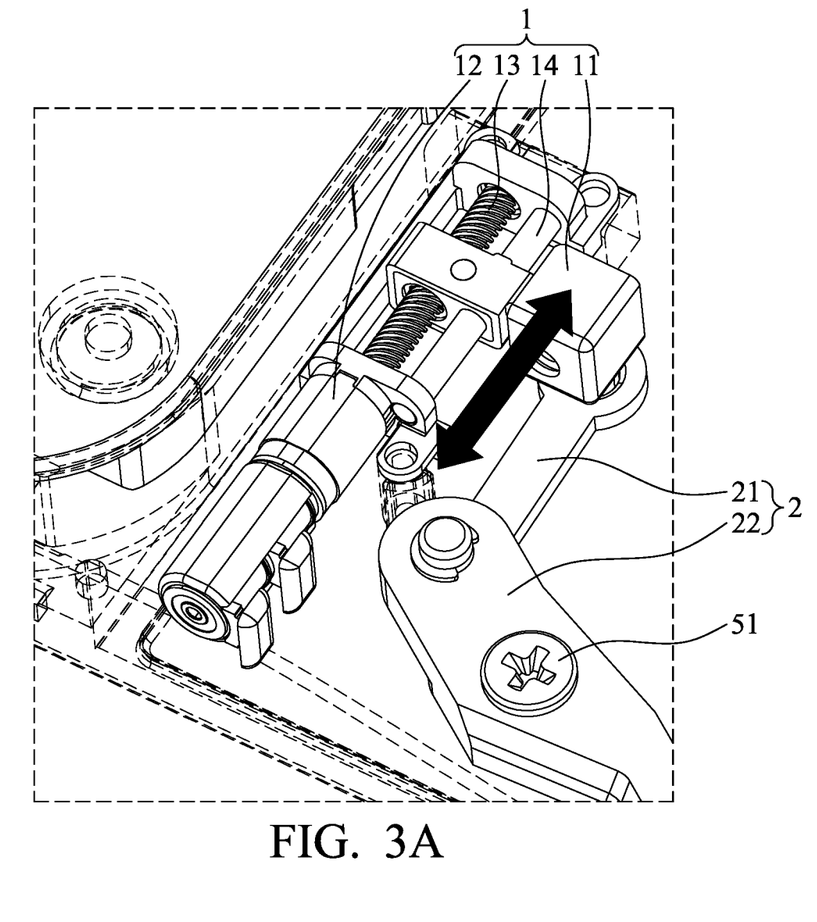
FIG. 3A shows the details of the actuating unit of the embodiment of the invention, wherein the holder is in the extended orientation.
Figure 3B:
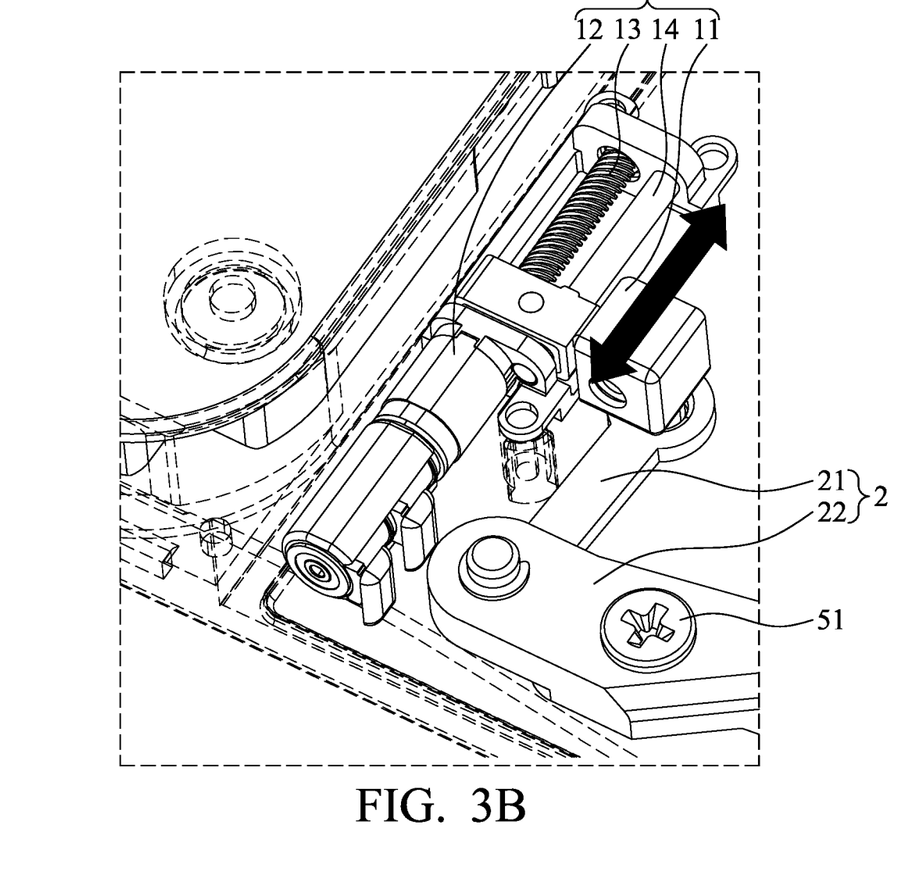
FIG. 3B shows the details of the actuating unit of the embodiment of the invention, wherein the holder is in the received orientation.

FIG. 3A shows the details of the actuating unit of the embodiment of the invention, wherein the holder is in the extended orientation. FIG. 3B shows the details of the actuating unit of the embodiment of the invention, wherein the holder is in the received orientation. With reference to FIGS. 1, 2, 3A and 3B, in one embodiment, the actuating unit 1 comprises a block 11. The block 11 is connected to the first rod 21. The block 11 is adapted to be linearly moved between a first position (FIGS. 1 and 3A) and a second position (FIGS. 2 and 3B). When the block 11 is in the first position (FIGS. 1 and 3A), the holder 3 is in the extended orientation. When the block 11 is in the second position (FIGS. 2 and 3B), the holder 3 is in the received orientation.

With reference to FIGS. 1, 2, 3A and 3B, in one embodiment, the actuating unit 1 further comprises an electric motor 12, a threaded rod 13 and a guide post 14. The electric motor 12 is connected to the threaded rod 13. The block 11 is connected to the threaded rod 13 and the guide post 14. The electric motor 12 is adapted to rotate the threaded rod 13, and the threaded rod 13 moves the block 11 along the guide post 14.

In another embodiment, the actuating unit can comprise an electric motor, a gear and a rack. The disclosure is not meant to restrict the invention. For example, the electric motor is connected to the gear, and the gear is connected to the rack, and the first rod 21 of the linkage unit 2 is moved thereby.

Figure 4A:
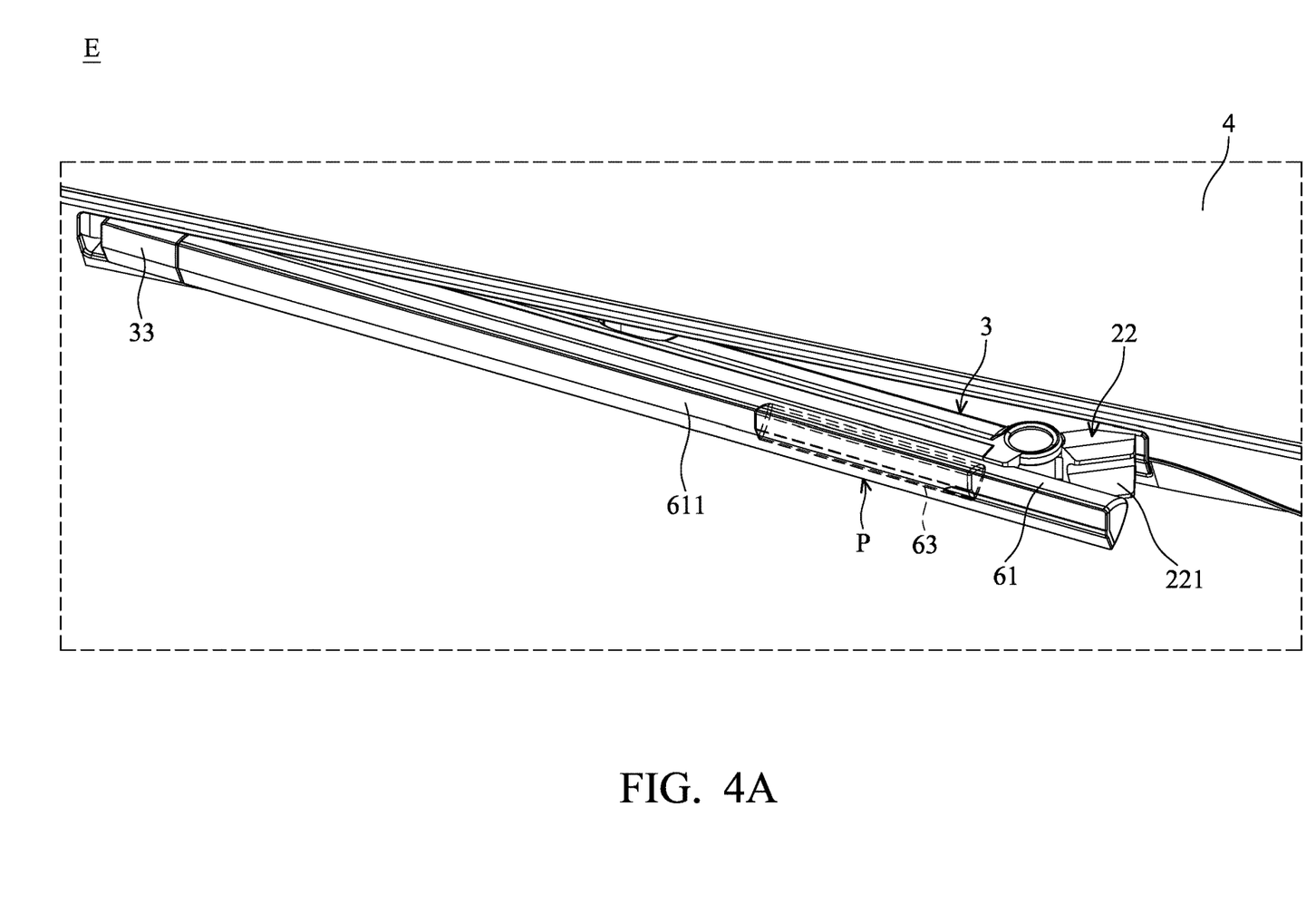
FIG. 4A shows a stylus pen of the embodiment of the invention combined with the holder, wherein the holder is in the extended orientation.
Figure 4B:
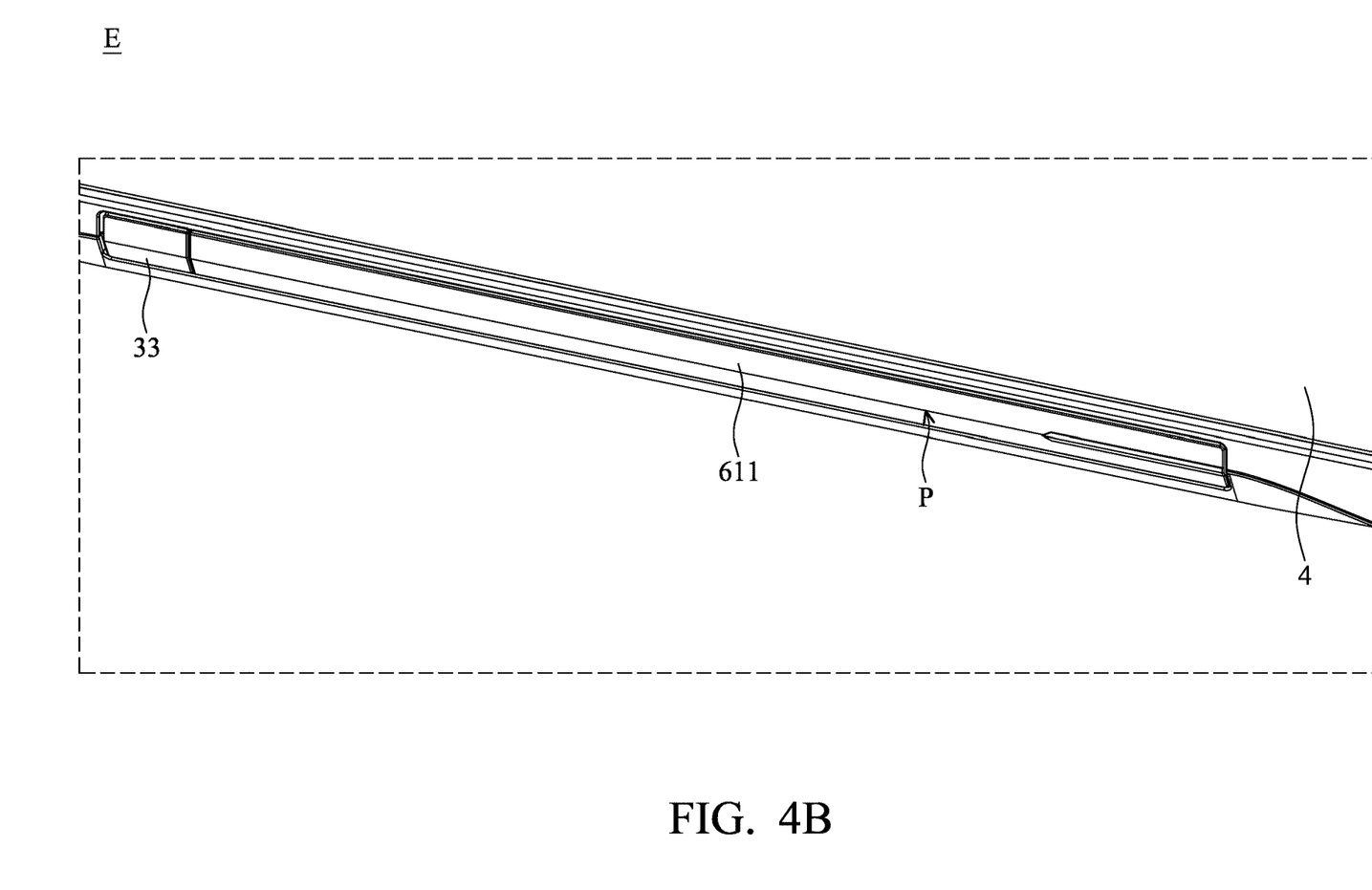
FIG. 4B shows the stylus pen of the embodiment of the invention combined with the holder, wherein the holder is in the received orientation.
Figure 4C:
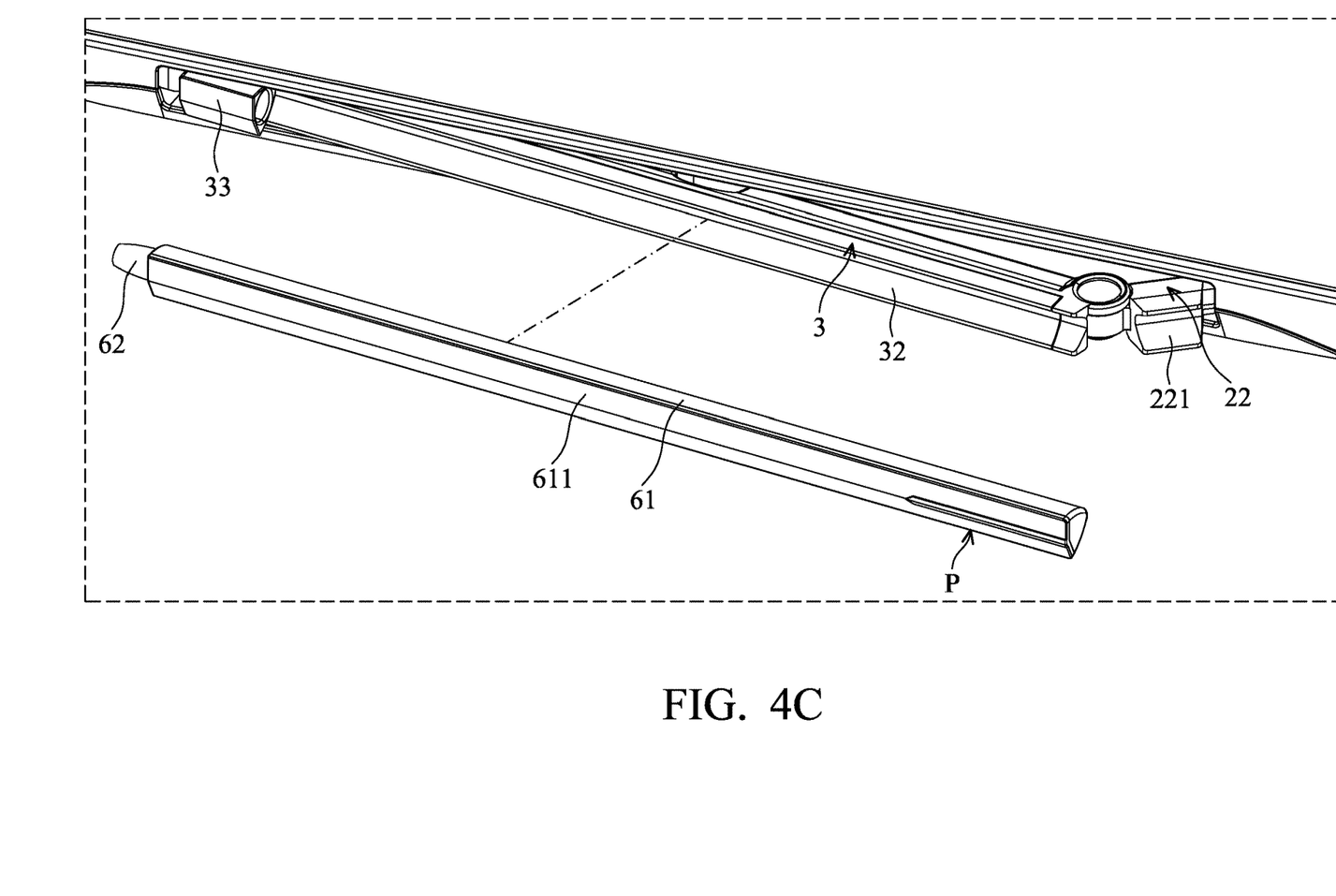
FIG. 4C shows the stylus pen of the embodiment of the invention separated from the holder.

FIG. 4A shows a stylus pen of the embodiment of the invention combined with the holder, wherein the holder is in the extended orientation. FIG. 4B shows the stylus pen of the embodiment of the invention combined with the holder, wherein the holder is in the received orientation. FIG. 4C shows the stylus pen of the embodiment of the invention separated from the holder. To clearly present the relationship of the elements of the embodiment of the invention, the angle of view of FIGS. 4A, 4B and 4C is different from that of FIGS. 1, 2, 3A and 3B. With reference to FIGS. 2, 4A, 4B and 4C, in one embodiment, the object P is a stylus pen. The stylus pen P comprises a pen body 61 and a pen nib 62. The pen nib 62 is connected to the pen body 61. The holder 3 comprises a holding recess 32. The pen body 61 is adapted to be disposed in the holding recess 32. When the holder 3 is in the received orientation (FIG. 4B), the stylus pen P is adapted to be received in the device housing 4 (i.e. a body surface 611 of the pen body 61 and the device housing 4 are a part of the appearance of the electronic device E). Additionally, when the holder 3 is in the received orientation, one end of the stylus pen P is adapted to be restricted by the device housing 4 (FIGS. 2 and 4B).

In another embodiment, the object P can be an element other than the stylus pen. The disclosure is not meant to restrict the invention.

With reference to FIGS. 1, 4A, 4B and 4C, in one embodiment, the holder 3 comprises a nib container 33. The nib container 33 is located between the slot 31 and the holding recess 32. The pen nib 62 is adapted to be inserted into the nib container 33. The nib container 33 provides the receiving and restricting functions. In one embodiment, the nib container 33 has a container surface. The container surface, the pen body 61 and the device housing 4 are a part of the appearance of the electronic device E.

With reference to FIGS. 4A and 4B, in one embodiment, the holder 3 comprises a magnetizable material, such as, iron or other magnetizable metal. The stylus pen P comprises a magnet 63. The magnet 63 is disposed in the pen body 61. The magnet 63 is adapted to be attached to the holder 3 by magnetic force.

With reference to FIGS. 1, 2, 4A and 4C, in one embodiment, the second rod 22 further comprises a restriction recess 221. The restriction recess 221 is adapted to be connected to the pen body 61. In one embodiment, the second rod 22 comprises a magnetizable material, such as, iron or other magnetizable metal. In another embodiment, the second rod can be made of plastic or other materials with structural strength.

In one embodiment, the electronic device can be a notebook, a tablet, a cell phone or other electronic devices. The electronic device can further comprises a control unit and a operation interface. The operation interface can be a software or a hardware. The control unit is coupled to the actuating unit. The user can operate the operation interface to send a control signal. The control unit actuates the actuating unit according to the control signal, and the holder is thus rotated between the extended orientation and the received orientation relative to the device housing.

In one embodiment, when the holder is in the extended orientation for a predetermined time, the control unit actuates the actuating unit to move the holder back to the received orientation. The predetermined time can be, for example, 5 seconds.

In another embodiment, the electronic device can further comprises a sensor. The sensor is disposed on the holder. The sensor is coupled to the control unit. When the user detaches the stylus pen from the holder, the sensor sends a sensed signal to control unit. The control unit actuates the actuating unit according to the sensed signal, and the holder is back to the received orientation automatically. The sensor can be a Hall sensor.

Utilizing the electronic device of the embodiment of the invention, when the user needs to use the stylus pen, the user operate the operation interface to send the control signal, and the holder is rotated to the extended orientation. The user therefore can take the stylus pen easily. Compared with the conventional art, the electronic device of the embodiment of the invention is convenient and provides an elegant operation experience.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with a receiving function, comprising:
   a device housing;
   an actuating unit, disposed in the device housing;
   a linkage unit, connected to the actuating unit, wherein the actuating unit is adapted to move the linkage unit; and
   a holder, connected to the device housing and the linkage unit, wherein the holder is adapted to be rotated between an extended orientation and a received orientation relative to the device housing, a stylus pen is detachably connected to the holder, one end of the holder is rotatably connected to the device housing, and the other end of the holder is rotatably connected to the linkage unit, the holder comprises a slot, the device housing comprises a housing post, and the holder is slidably connected to the housing post via the slot;
   wherein the stylus pen comprises a pen body and a pen nib, the pen nib is connected to the pen body, the holder comprises a holding recess, the pen body is adapted to be disposed in the holding recess, and when the holder is in the received orientation, the stylus pen is adapted to be received in the device housing, and a body surface of the pen body and the device housing are a part of the appearance of the electronic device,
   wherein the linkage unit comprises a first rod and a second rod, one end of the first rod is rotatably connected to the actuating unit, the other end of the first rod is rotatably connected to one end of the second rod, the other end of the second rod is rotatably connected to the holder, the second rod pivots on the device housing, the second rod comprises a restriction recess, and when the holder is in the received orientation, the restriction recess is adapted to be directly contact to the pen body, and when the holder is in the extended orientation, the restriction recess is separated from the pen body.

2. The electronic device as claimed in claim 1, wherein the actuating unit comprises a block, the block is connected to the first rod, the block is adapted to be linearly moved between a first position and a second position, and when the block is in the first position, the holder is in the extended orientation, and when the block is in the second position, the holder is in the received orientation.

3. The electronic device as claimed in claim 2, wherein the actuating unit further comprises an electric motor, a threaded rod and a guide post, the electric motor is connected to the threaded rod, the block is connected to the threaded rod and the guide post, the electric motor is adapted to rotate the threaded rod, and the threaded rod moves the block along the guide post.

4. The electronic device as claimed in claim 1, wherein the holder comprises a nib container, the nib container is located between the slot and the holding recess, and the pen nib is adapted to be inserted into the nib container.

5. The electronic device as claimed in claim 1, wherein the holder comprises a magnetizable material, the stylus pen comprises a magnet, the magnet is disposed in the pen body, and the magnet is adapted to be attached to the holder by magnetic force.

* * * * *